United States Patent [19]

Small et al.

[11] Patent Number: 5,246,129

[45] Date of Patent: * Sep. 21, 1993

[54] SHIPPING TRAY AND COVER STRIP

[75] Inventors: Edith M. Small, New Lenox; Kenneth R. Steinhart, Frankfort, both of Ill.

[73] Assignee: Illinois Tool Works, Inc., Glenview, Ill.

[*] Notice: The portion of the term of this patent subsequent to Apr. 29, 2010 has been disclaimed.

[21] Appl. No.: 850,880

[22] Filed: Mar. 13, 1992

[51] Int. Cl.⁵ .............................................. B65D 85/38
[52] U.S. Cl. ................................... 220/23.4; 206/328; 206/561
[58] Field of Search ............................... 206/328-334, 206/503, 508, 509, 561, 564; 220/23.2, 23.4, 23.8

[56] References Cited

U.S. PATENT DOCUMENTS

| | | | |
|---|---|---|---|
| 3,701,079 | 10/1972 | Bowden et al. | 206/329 |
| 4,448,306 | 5/1984 | Sinnadurai et al. | 206/332 |
| 4,595,096 | 6/1986 | Sinnadurai et al. | 206/331 |
| 4,620,632 | 11/1986 | Alemanni | 206/329 |
| 4,671,407 | 6/1987 | Brutosky | 206/332 |
| 5,103,976 | 4/1992 | Murphy | 206/328 |
| 5,109,981 | 5/1992 | Maston, III et al. | 206/331 |
| 5,131,535 | 7/1992 | O'Connor et al. | 206/332 |

Primary Examiner—Jimmy G. Foster
Attorney, Agent, or Firm—Kane, Dalsimer, Sullivan, Kurucz, Levy, Eisele and Richard

[57] ABSTRACT

A packaging means for shipping electronic components includes a tray in the form of an open latticework within a frame. The open latticework includes internal pockets, where electronic components may be seated. The internal pockets are arranged in rows and columns within the frame, the columns being joined to one another and to the frame by severable joining members. By clipping the appropriate joining members, a strip of internal pockets may be removed from the tray in order to ship less than a complete tray-load of electronic components to a customer. A cover strip, designed for attachment to a strip on which electronic components are seated, is provided to hold the components firmly within the internal pockets of the strip for shipment.

9 Claims, 4 Drawing Sheets

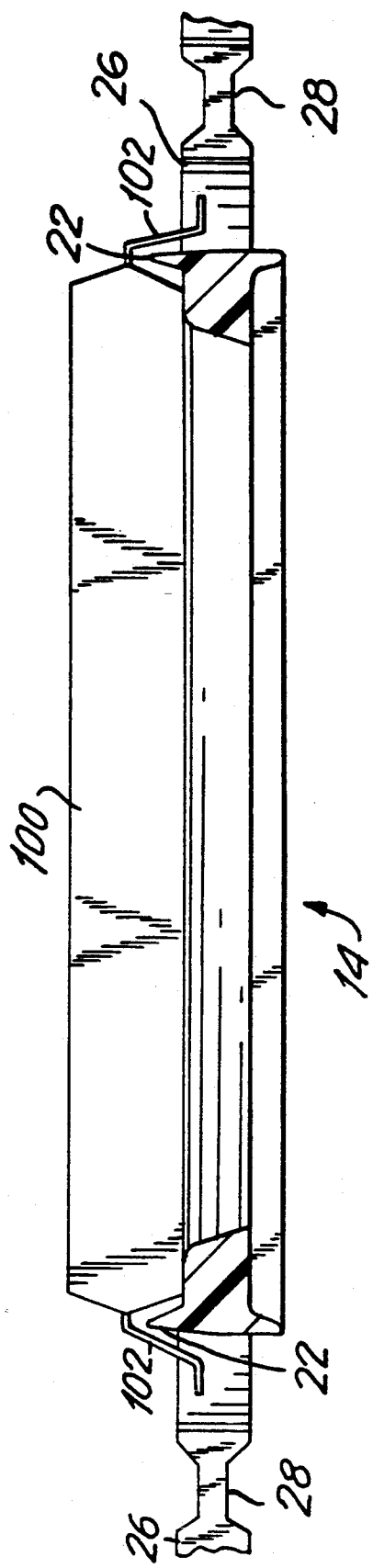

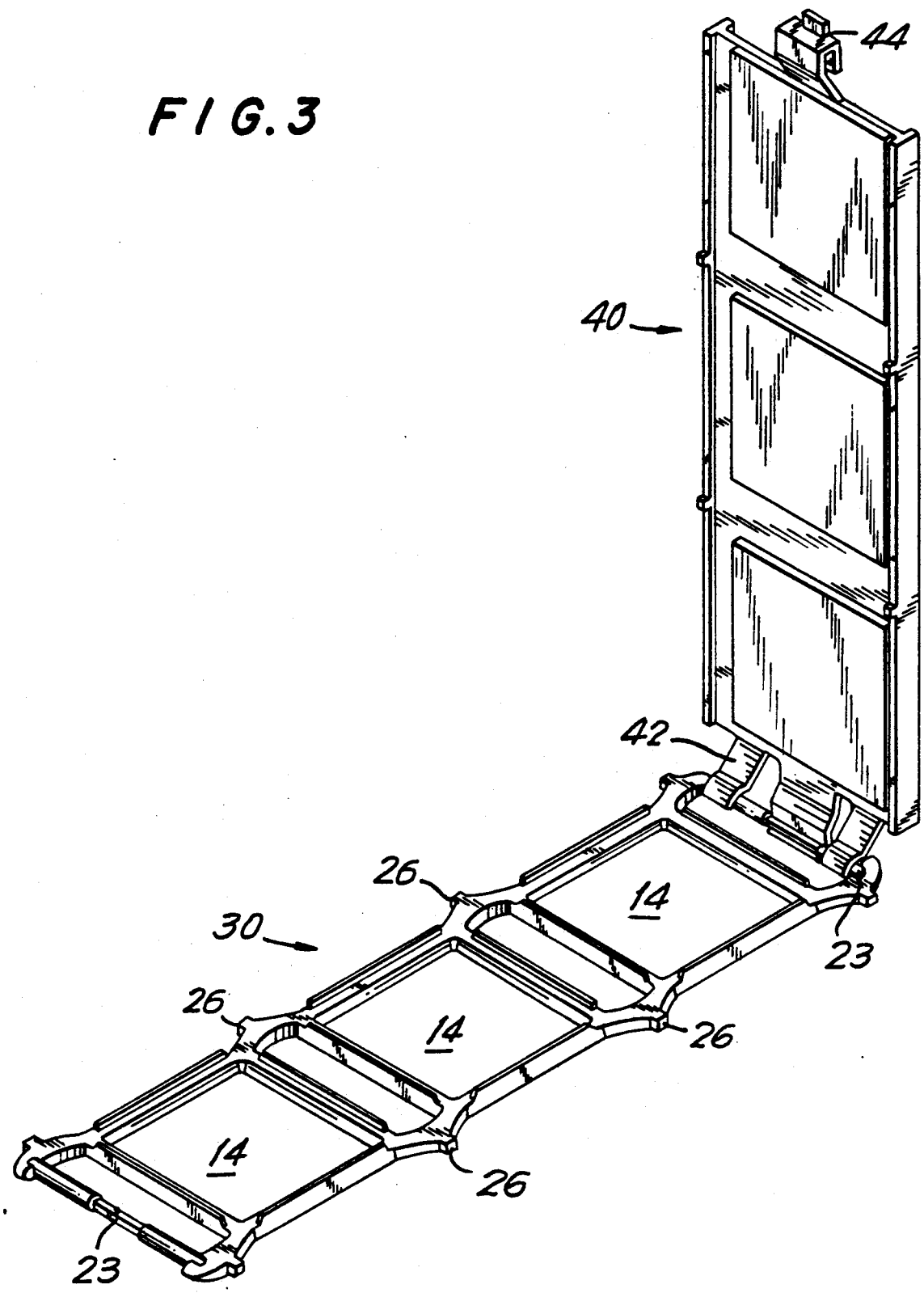

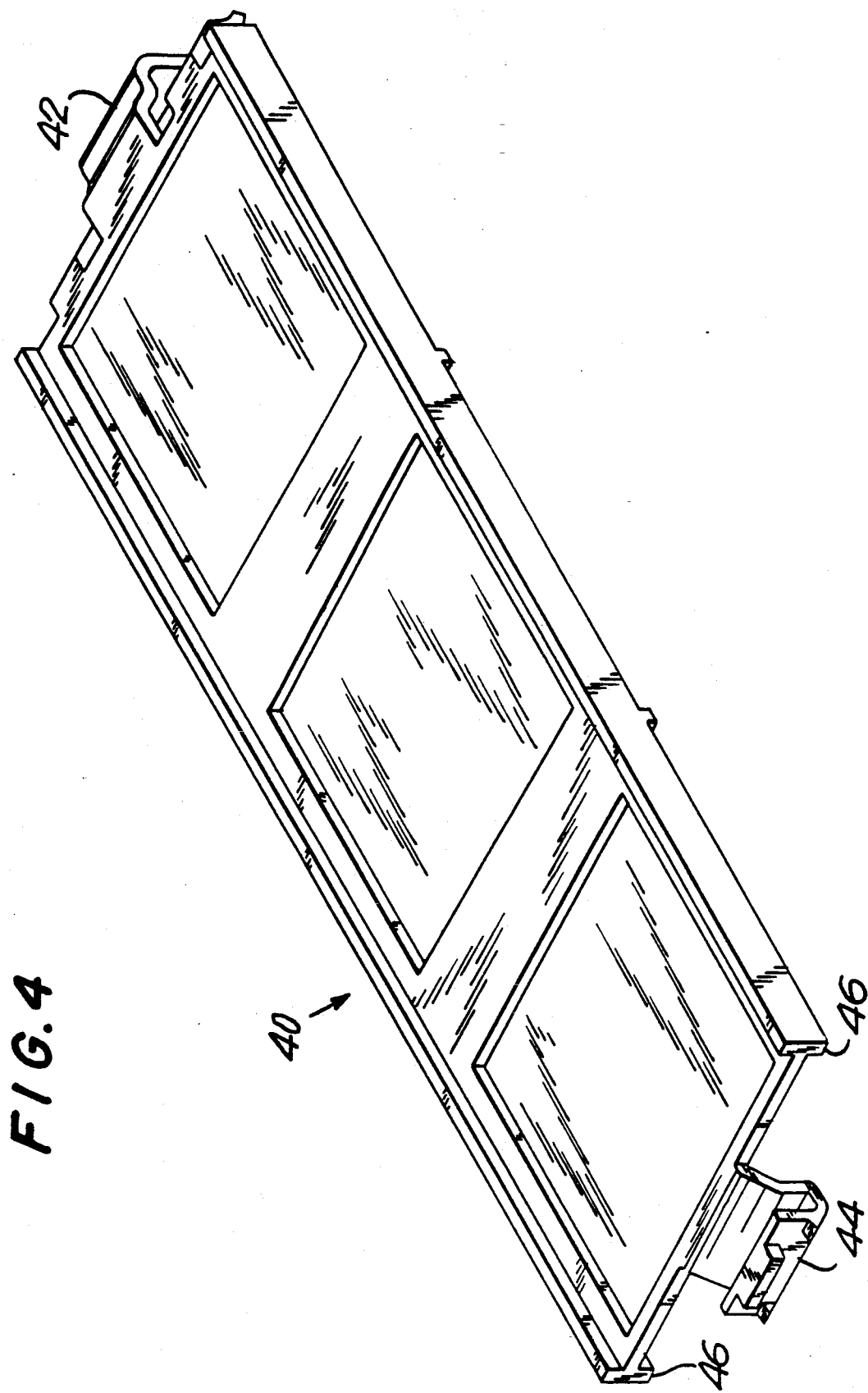

SHIPPING TRAY AND COVER STRIP

BACKGROUND OF THE INVENTION

1. Field of the Invention

The present invention relates generally to the packaging means used to ship delicate electronic components from manufacturer to consumer. More specifically, the present invention constitutes a packaging means particularly well suited for shipping a small number of such components.

2. Description of the Prior Art

Delicate electronic components, such as those which include the integrated circuit devices commonly known as chips, are generally shipped in injection-molded plastic trays. The trays themselves include a frame and a number of internal pockets, each of which may contain electronic components to be shipped. The internal pockets, however, cannot be readily separated from the frame or from one another, in a manner that would permit less than a full tray of electronic components to be shipped without compromising the dimensions and physical integrity of the pockets themselves. In addition, since the leads of such components are extremely delicate, heretofore, it has been difficult to handle and separate components for shipment for fear of damaging the leads.

The present invention provides a solution to the shortcomings in the prior-art trays of this type in the form of a tray from which an individual pocket or strip of pockets housing an electronic component or components may be clipped out with an appropriate tool and inserted into a shipping tube for dispatch to a customer. The pockets are defined within raised rims to permit stacking.

SUMMARY OF THE INVENTION

The present invention is a shipping tray and cover strip which includes a one-piece injection-molded tray having a plurality of internal pockets for seating electronic components. The tray itself is an open latticework within a frame, which defines the tray's outer periphery. The plurality of internal pockets are arranged within the frame in rows and columns in a grid-like pattern. Each internal pocket is an open-sided figure, such as a square or rectangle, each side of which has a raised lip defining a rim, so that an electronic component may be seated therewithin with its leads completely protected.

Within each row of internal pockets, adjacent pockets are joined to one another by at least one connecting member. The rows, in turn, are joined to each other and to the frame by a plurality of joining members. Each joining member has a narrowed portion, which may be readily cut or severed to remove a row of internal pockets from the tray, thereby forming a strip of internal pockets, to ship a small number of electronic components, rather than an entire tray-load. Prior to any such removal, however, the tray, comprising frame, internal pockets, and connecting and joining members, is an integral structure.

Also included in this integral structure, between both ends of each row of internal pockets and the frame, are cover members, whose purpose may be readily understood upon reading the immediately following paragraph. The cover members may have a substantially rounded cross section. One cover member may be disposed between each end of each row of internal pockets and the frame.

The present invention also comprises a cover strip, which is designed to hold at least one electronic component within at least one internal pocket in a given row of internal pockets. The cover strip has, at one end, hinge means and, at the other, latch means. The hinge means engage with a side of an internal pocket adjacent to one side of an internal pocket to be covered, or with a cover member of the variety described in the preceding paragraph, and the latch means engage with a side of an internal pocket adjacent to the opposite side of an internal pocket to be covered, or with a cover means, where the internal pocket being covered is the last in a row. The cover strip may be of a length sufficient to cover one, two, or more internal pockets within a given row.

Since all the pockets in the entire tray are filled with electronic components when they are received from manufacturers, the present invention may find use, when only a few electronic components need to be shipped, by snapping a cover strip of appropriate length over the entire row of internal pockets, and by severing the appropriate joining members to detach the loaded internal pockets from the tray for shipping in the form of a strip.

The present invention will now be described in more complete detail with reference being made, where appropriate, to the several figures which are identified below.

BRIEF DESCRIPTION OF THE DRAWINGS

FIG. 2 is a cross section taken as indicated by line 2—2 in FIG. 1;

FIG. 3 depicts a strip formed by removing a row of internal pockets, the row including three such pockets, from the tray and a cover strip;

FIG. 4 shows the top side of the cover strip.

DETAILED DESCRIPTION OF THE PREFERRED EMBODIMENT

Figure 1:
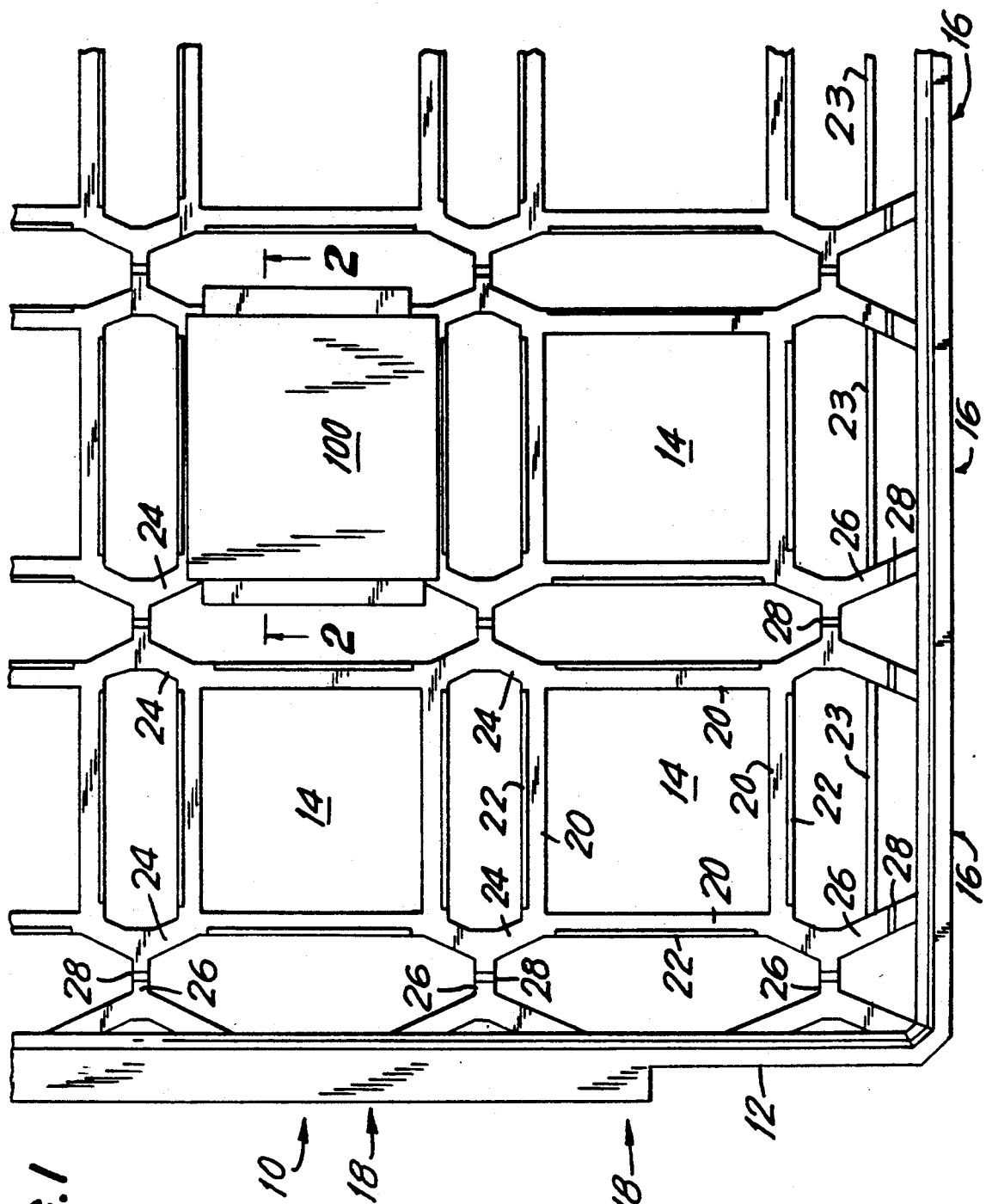
FIG. 1 is a plan view of a portion of the tray element of the packaging means for shipping electronic components.

Turning first to FIG. 1, the tray 10 element of the present invention includes a frame 12 which forms its outer periphery. Within frame 12 are a plurality of internal pockets 14 arranged in rows 16 and columns 18. Each internal pocket 14 is defined by a plurality of sides 20; said plurality may be four, in which case the internal pockets 14 may be of rectangular or square shape. Each side 20 has a raised lip defining rim 22 so that an electronic component of appropriate size may be seated within the internal pocket 14 secured in position by rim 22. By properly dimensioning the lip with respect to the length of the leads of the component to be packaged therein, the trays may be stacked on top of each other without danger of damaging the leads.

The internal pockets 14 in each row 16 are connected to one another by at least one connecting member 24. The rows 16 are joined to one another and to frame 12 by joining members 26. Each joining member 26 has a narrowed portion 28. By severing the narrowed portion 28 of the appropriately chosen joining members 26, a row 16 of internal pockets 14 may be removed from the tray 10 for use as a strip.

At each end of each row 16 of internal pockets 14 is a cover member 23. The cover member 23 may extend, as shown in FIG. 1, from one joining member 26 to another, connecting points thereon between the last internal pocket 14 in the row 16 and the narrowed portion 28 of the joining member 26. In such a manner, the cover member 23 may form a part of the strip obtained from a row 16 of internal pockets 14 by severing the appropriate narrowed portions 28. Advantageously, cover member 23 may be parallel to a side 20 of an adjacent internal pocket 14, and may be separated therefrom by a distance substantially equal to that separating the sides 20 of two adjacent internal pockets 14 in a given row 16.

An electronic component 100 is shown, for purposes of illustration, seated within one of the internal pockets 14 of tray 10. But for the presence of electronic components 100 in FIG. 1, the entire tray 10 would have the appearance of an open latticework.

FIG. 2, which is a cross section taken as indicated by line 2—2 in FIG. 1, shows electronic component 100 seated within an internal pocket 14 inside the rim 22 on sides 20. Narrowed portions 28 of joining members 26 may be seen clearly in the figure. It should also be noted that the leads 102 of the electronic component 100 may reside in the open spaces between the rows 16 and columns 18 of internal pockets 14, where they will be less susceptible to damage.

In FIG. 3, a means for packaging three electronic components according to the present invention is shown. The strip 30 having three internal pockets 14 has been obtained by clipping several narrowed portions 28 of joining members 26 to free a row 16 of internal pockets 14 from tray 10, where row 16 includes three such internal pockets 14.

The cover strip 40 is attached to strip 30 by engaging hinge means 42 to a cover member 23 adjacent to an internal pocket 14 to be covered. Latch means 44 at the opposite end of cover strip 40 may engage with cover member 23 adjacent to an internal pocket 14 at the opposite end of those to be covered when the cover strip 40 is closed. As shown in FIG. 3, the cover strip 40 spans three internal pockets 14, so that three electronic components may be shipped therein.

FIG. 4 shows the top side of cover strip 40, that is, the side visible when the cover strip 40 is closed upon a strip of internal pockets 14. The lateral sides of the cover strip 40 are provided with a flange 46, so that, when closed upon strip 30, the electronic components housed therein may be completely enclosed and protected from possible damage during shipment to a customer. In actual use, cover strip 40 is snapped onto strip 30 to hold an electronic component or components thereon before the strip 30 is clipped from the tray 10. Once removed from the tray 10, the strip 30 and cover strip 40 are ready for shipment in a suitable container such as an extruded tube for physical protection during shipment.

In addition to the hinge connection between cover strip 40 and strip 30, another important feature of the invention resides in the fact that the trays 10 may be stacked on top of each other without damaging the leads of the electronic components extending below the internal pockets 14. This is because the tray 10 is an open latticework. When an electronic component 100 is seated into an internal pocket 14, the leads 102 extend into the spaces in the tray 10 between the internal pockets 14, as previously noted and illustrated in FIG. 2.

Since the tray 10 and cover strip 40 are both made of injection-molded plastic, which may be static dissipative, or of conductive material, the electronic devices 100 may be protected from damage by electrostatic discharge.

The configuration of the severed strip 30 allows the leads 102 of the electronic components 100 to be protected while inside a shipping tube, since only the furtherest outside walls of the strip 30 contact the internal walls of the shipping tube. Leads 102 closest to the opening of the tube are protected since the ends of the severed strip 30 come into contact with the end closure of the tube and act as a barrier between the end cap and the exposed leads.

Since the narrowed portions 28 of the joining members 26 are easily identifiable and enable strip 30 of uniform dimension for a given type of electronic component 100 to be severed from the trays 10, shipping tubes of appropriate size could be manufactured to accommodate strips for the various types of electronic components 100 being shipped.

In the trays of the prior art, the spaces separating the individual internal pockets are not open, as are those of the trays of the present invention. This contributes to the likelihood that the leads on the electronic components might be damaged by coming into contact with the flat surface between the internal pockets. In the present invention, the leads reside in the spaces in the open latticework of the tray, thereby avoiding this problem of the prior art.

In addition, when prior-art trays are used, and electronic components are improperly placed in the internal pockets, the components may slip from their pockets and come into contact with others on the tray. This could result in damage to the leads of the component that has moved, as well as to those remaining in their pockets but struck by the one which has moved. The tray of the present invention adds greater protection to adjacent components since the leads of a component which has happened to be jostled from its internal pocket are more likely to come into contact with a connecting member in the open latticework of the tray than with the leads of an adjacent device.

Finally, the open format of the tray of the present invention allows automatic vision systems to scan the leads to inspect them without removing the electronic components individually from the tray.

Modifications to the above would be obvious to those skilled in the art, yet would not bring the device so modified beyond the scope of the appended claims. Specifically, it should be readily apparent that narrowed sections may be provided in the connecting members 24 to enable a single pocket 14 or strip of pockets less than the full length of the tray to be separated.

What is claimed is:

1. A package for shipping components comprising:
    an open latticework integral tray defining a plurality of pockets, each of said pockets being bordered by a plurality of sides, each of said sides having a raised lip which cooperates with lips of other sides of said pocket in defining a rim within which a component may be seated; and,
    a member for joining at least one side of one pocket with at least one side of an adjacent pocket, said joining member having a narrowed portion therein to facilitate the severing thereof.

2. The package in accordance with claim 1 wherein said pockets are arranged in a grid-like pattern of rows and columns and said joining members join pockets in adjacent rows to one another.

3. The package in accordance with claim 2 further comprising members connecting at least one side of one pocket to one side of an adjacent pocket in the same row.

4. The package in accordance with claim 3 further comprising a frame defining an outer periphery of said tray, said frame having two row elements extending generally parallel to said columns and two column elements extending generally parallel to said rows.

5. The package in accordance with claim 4 comprising joining members extending from said frame column elements to an adjacent pocket side, each of said last mentioned members being provided with a narrowed section to facilitate the severing thereof.

6. A packaging means for shipping components, said packaging means comprising:

a tray, said tray being an open latticework including a frame, said frame being the outer periphery of said tray; a plurality of internal pockets for housing components within said frame, said plurality of internal pockets each being defined by a plurality of sides having a raised lip defining a rim within which a component may be seated, said plurality of internal pockets being arranged in a grid-like pattern of rows and columns, said internal pockets in each of said rows being joined to one another by at least one connecting member; said rows being joined to one another and to said frame by a plurality of joining members, said joining members having narrowed portions for severing said row from said tray to form a strip of internal pockets; said frame, plurality of internal pockets, connecting members, and joining members forming an integral whole; and a cover strip, said cover strip having a hinge means and a latch means, and having a length and a width sufficient to cover at least one internal pocket in one of said columns so as to secure a component therewithin, said hinge means attaching to a side of an internal pocket on one side of said at least one internal pocket to be covered and said latch means clipping to a side of an internal pocket on another side of said internal pocket to be covered in said row.

7. A packaging means as claimed in claim 6 wherein said tray further comprises at least one cover member, said cover member extending between two of said joining members connecting one of said rows of said internal pockets to said frame, said cover member being substantially parallel to a side of an internal pocket adjacent thereto, said cover member extending between points on said joining members closer to said internal pocket than said narrowed portions of said joining members, so that, when said row is severed from said tray, said cover member may be at an end of said strip of internal pockets thereby obtained.

8. A packaging means as claimed in claim 7 wherein said cover member has a substantially rounded cross section.

9. A packaging means as claimed in claim 7 wherein said cover member is separated from a side of an internal pocket adjacent thereto by a distance substantially equal to that separating adjacent sides of adjacent internal pockets in a row thereof.

* * * * *